(12) United States Patent
Lagrange et al.

(10) Patent No.: US 10,183,311 B2
(45) Date of Patent: Jan. 22, 2019

(54) METHOD FOR ALUMINIZING A SURFACE BY MEANS OF THE ADVANCE DEPOSITION OF A PLATINUM AND NICKEL LAYER

(75) Inventors: Frederic Lagrange, Avanton (FR); Denis Manesse, Chatellerault (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 659 days.

(21) Appl. No.: 13/805,192

(22) PCT Filed: Jun. 10, 2011

(86) PCT No.: PCT/FR2011/051330
§ 371 (c)(1),
(2), (4) Date: Mar. 1, 2013

(87) PCT Pub. No.: WO2011/157935
PCT Pub. Date: Dec. 22, 2011

(65) Prior Publication Data
US 2013/0175178 A1    Jul. 11, 2013

(30) Foreign Application Priority Data
Jun. 18, 2010 (FR) ..................... 10 54850

(51) Int. Cl.
*C23C 18/08* (2006.01)
*C23C 2/02* (2006.01)
(Continued)

(52) U.S. Cl.
CPC ............... *B05D 1/36* (2013.01); *C23C 10/28* (2013.01); *C23C 16/0281* (2013.01);
(Continued)

(58) Field of Classification Search
CPC ......... C23C 14/00; C23C 28/02; C23C 26/00; C23C 28/023; C23C 28/021; C23C 18/08;
(Continued)

(56) References Cited

U.S. PATENT DOCUMENTS 3,287,169 A * 11/1966 Rogers ................ H01M 4/8626
164/46
5,015,502 A * 5/1991 Strangman ............ C23C 14/083
427/248.1
(Continued)

FOREIGN PATENT DOCUMENTS

CN     1986889 A      6/2007
EP     1 254 967      11/2002
(Continued)

OTHER PUBLICATIONS

International Search Report dated Sep. 1, 2011 in PCT/FR11/051330 Filed Jun. 10, 2011.
(Continued)

*Primary Examiner* — Zulmariam Mendez
(74) *Attorney, Agent, or Firm* — Oblon, McClelland, Maier & Neustadt, L.L.P.

(57) ABSTRACT

A method for depositing an aluminizing coating onto a substrate. The method includes: (a) depositing a layer, containing platinum and at least 35% of nickel, onto a surface of the substrate; and (b) depositing an aluminum coating onto the layer.

10 Claims, 1 Drawing Sheet

(51) Int. Cl.
  *C23C 10/48* (2006.01)
  *C25D 5/34* (2006.01)
  *B05D 1/36* (2006.01)
  *C23C 10/28* (2006.01)
  *C23C 16/02* (2006.01)
  *C23C 16/06* (2006.01)
  *C23C 28/02* (2006.01)
  *C25D 5/12* (2006.01)
  *C25D 3/12* (2006.01)
  *C25D 5/40* (2006.01)

(52) U.S. Cl.
  CPC ............ *C23C 16/06* (2013.01); *C23C 28/023* (2013.01); *C25D 3/12* (2013.01); *C25D 5/12* (2013.01); *C25D 5/40* (2013.01); *Y02T 50/67* (2013.01)

(58) Field of Classification Search
  CPC ........... C23C 2/02; C23C 10/02; C23C 10/48; C23C 18/1658; F05D 2230/90; F01D 5/288; C25D 3/50; C25D 3/12; C25D 5/10; C25D 7/00; C25D 5/12; C25D 5/34; C25D 13/20; C25D 17/001
  USPC ........................................................ 205/184
  See application file for complete search history.

(56) References Cited

U.S. PATENT DOCUMENTS

| | | |
|---|---|---|
| 5,716,720 A | 2/1998 | Murphy |
| 5,856,027 A | 1/1999 | Murphy |
| 2003/0157363 A1 | 8/2003 | Rigney et al. |
| 2005/0036892 A1* | 2/2005 | Bajan ................ C23C 4/02 416/241 R |
| 2005/0132717 A1 | 6/2005 | Saint Ramond et al. |
| 2007/0071991 A1* | 3/2007 | Bacos ................ C25D 5/10 428/610 |
| 2007/0138019 A1 | 6/2007 | Kasule |
| 2009/0087572 A1* | 4/2009 | Saint-Ramond et al. .... 427/405 |
| 2009/0162684 A1 | 6/2009 | Creech |

FOREIGN PATENT DOCUMENTS

| | | |
|---|---|---|
| EP | 1 528 118 | 5/2005 |
| FR | 2 924 129 | 5/2009 |
| JP | 2005-188505 A | 7/2005 |

OTHER PUBLICATIONS

Office Action dated Jun. 27, 2014 in the corresponding Chinese Patent Application No. CN 2011800299840.
Office Action dated Jan. 20, 2015 in the corresponding Japanese Patent Application No. 2013-514760 (English Translation only).

* cited by examiner

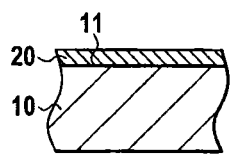
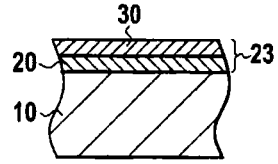
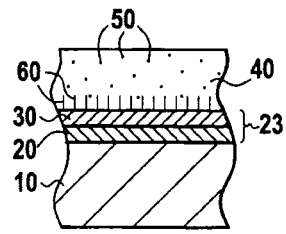
FIG.1A    FIG.1B    FIG.1C
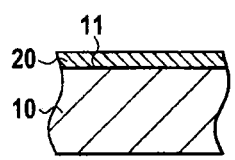
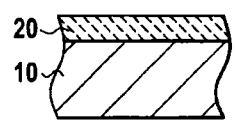
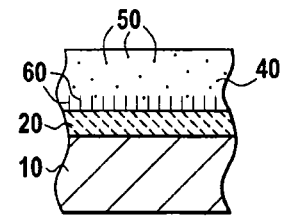
FIG.2A    FIG.2B    FIG.2C
PRIOR ART    PRIOR ART    PRIOR ART

METHOD FOR ALUMINIZING A SURFACE BY MEANS OF THE ADVANCE DEPOSITION OF A PLATINUM AND NICKEL LAYER

BACKGROUND OF THE INVENTION

Field of the Invention

The present invention relates to a method for depositing an aluminizing coating on a substrate.

Description of the Related Art

Aluminum-based coatings, called "aluminizing coatings," are used to protect the surface of parts operating at high temperatures and in oxidizing environments. Such a coating may also serve as a fastening layer for attaching to another protective coating, said protective coating being more able to adhere to such an aluminizing coating than to the surface of the part itself.

For example, such parts are found in aeronautic turbojet engines, such as airplane engines. These parts are in particular turbine vanes or nozzles.

These parts are for example made from nickel-based superalloys.

To perform an aluminizing coating on such a superalloy, a layer of platinum 20 is first deposited on the surface 11 of said superalloy that is the substrate 10. This step is illustrated in FIG. 2A.

A thermal diffusion treatment is then done intended to diffuse the nickel of the superalloy 10 in the layer of platinum 20, and the platinum in the superalloy 10. This step is illustrated in FIG. 2B. This diffusion thus makes it possible to bring the nickel toward the free surface of the layer of platinum 20. This diffusion is done in a vacuum enclosure at a high temperature, for example 1100° C., for two hours.

A thermochemical aluminizing treatment is then done that leads to the deposition of a layer of aluminum 40 on the layer of platinum 20. This step is illustrated in FIG. 2C. Following this deposition, $PtAl_2$ compounds 50 form in the layer of aluminum 40 that are dispersed in said layer of aluminum. The diffusion step is essential to prevent the formation of a large quantity of $PtAl_2$, which then groups together to form plates on the surface of the layer of aluminum 40 that decrease the effectiveness of the protection. In fact, owing to this diffusion step, the nickel that has diffused in the layer of platinum 20 diffuses in the layer of aluminum 40, where it forms NiAl compounds 60, which reduces the formation of $PtAl_2$ and therefore the risk of the formation of $PtAl_2$ plates on the surface of the layer of aluminum 40.

The drawback of this currently used method is that the diffusion treatment of the layer of platinum is long and costly.

BRIEF SUMMARY OF THE INVENTION

The present invention aims to resolve this drawback.

The invention aims to propose a method for depositing an aluminizing coating on a substrate, the cost and duration of which are decreased relative to the current method.

This aim is achieved owing to the fact that the method includes the following steps:
  (a) A layer containing platinum and at least 35% of nickel is deposited on a surface of the substrate,
  (b) An aluminum coating is deposited on this layer.

Owing to these arrangements, the total duration of the method for depositing the aluminizing coating is reduced, since there is no longer any diffusion step. Furthermore, the total cost of the deposition method for the aluminizing coating is decreased, since the deposition of a coating containing platinum and nickel can be done using known and inexpensive methods.

BRIEF DESCRIPTION OF THE SEVERAL VIEWS OF THE DRAWINGS

The invention will be better understood, and its advantages will appear more clearly, upon reading the following detailed description of one embodiment shown as a non-limiting example. The description refers to the appended drawings, in which:

FIGS. 1A, 1B and 1C illustrate the steps of the method for depositing an aluminizing coating according to the invention, FIGS. 2A, 2B and 2C illustrate the steps of the method for depositing an aluminizing coating according to the prior art.

DETAILED DESCRIPTION OF THE INVENTION

As shown diagrammatically in FIG. 1A, a part is considered whereof some or all of the surface must be protected by an aluminizing coating. This part thus constitutes a substrate 10.

The layer 23 containing platinum and at least 35% of nickel is deposited on the surface 11 of the substrate 10. This deposition may be done by electrolysis, for example by soaking the substrate 10 in an electrolytic bath containing platinum salts and nickel salts.

Below, the particular embodiment is described wherein the layer 23 is made up of a first layer 20 containing platinum and a second layer 30 containing nickel.

First, in a known manner, for example by electrolysis, a layer of platinum 20 (first layer) is deposited on the surface 11 of the substrate 10 (step (a), FIG. 1A). In this way, the substrate 10 is soaked in an electrolytic bath containing platinum salts, said substrate playing the role of an electrode (cathode), and a current is passed between that electrode and an upper electrode (anode) made from platinum. The platinum is then gradually deposited on the substrate.

The thickness of this layer of platinum is for example approximately 5 µm to 10 µm.

Beforehand, it is possible to prepare the surface 11 so as to obtain better attachment of the layer of platinum 20 on said surface 11. This preparation for example consists of making the surface rougher, the raised portions thus formed serving as catches for the layer of platinum 20.

The surface preparation may also be done in the more general case of a deposition of the layer 23 (made up of a layer of platinum 20 and a layer of nickel 30) on the surface 11.

No diffusion treatment of this platinum layer 20 is done.

As shown diagrammatically in FIG. 1B, a layer of nickel 30 (second layer) is deposited on the layer of platinum 20 (step (b), FIG. 1B).

The deposition of this layer of nickel 30 is for example done using the known electrolysis method. The part to be covered is soaked in an electrolytic bath containing nickel salts, said part serving as an electrode (cathode), and a current is passed between said electrode and another electrode (anode) made from nickel. The nickel is then gradually deposited on the part.

The advantage of the method according to the invention is that the deposition of the layer of platinum 20, then the layer of nickel 30 can be done consecutively in the same facility. This therefore saves time. Furthermore, these depositions may be done at a low temperature and ambient pressure, which is less expensive than the diffusion treatment used in the prior art (step illustrated in FIG. 2B), since this diffusion treatment must be done under vacuum at a high temperature.

A layer of aluminum 40 is next deposited on the layer of nickel 30 (step (c), FIG. 1C). This deposition is for example done using aluminum chemical vapor deposition (CVD). The substrate 10 coated with the layer of platinum 20 and the layer of nickel 30 is placed in an enclosure, in which gas-phase aluminum atoms are injected, said aluminum atoms being deposited on the layer of nickel 30. This deposition is done at a high temperature, for example approximately 1100° C., for 6 hours.

Advantageously, a vacuum is established beforehand in said enclosure, for example at 400 mbar and 1100 mbar.

This vacuum makes it possible to improve the quality of the aluminum deposition, in particular the uniformity of said deposition.

Owing to the presence of the layer of nickel 30, the nickel atoms diffuse directly from said layer of nickel 30 in the layer of aluminum 40, where it forms NiAl compounds 60, which reduces the formation of $PtAl_2$ compounds 50, and therefore the risk of the formation of $PtAl_2$ plates on the surface of the layer of aluminum 40.

Furthermore, the reduction of this $PtAl_2$ formation is more effective than in the method according to the prior art, as more nickel atoms diffuse in the layer of aluminum 40. In fact, the layer of nickel 30, which is in contact with a layer of aluminum 40, is made up of nearly 100% of nickel in the case of a deposition by electrolysis.

In general, the layer of nickel 30 contains enough nickel such that the layer 23 that is made up of the layer of platinum 20 and the layer of nickel 30 (or a single layer containing platinum and nickel) contains at least 35% of nickel.

On the contrary, in the prior art, the layer in contact with the layer of aluminum 40 comprises both platinum atoms and nickel atoms. However, the Ni—Pt—Al phase diagrams show that the NiAl compounds form to the detriment of the $PtAl_2$ even more easily inasmuch as the surface on which said layer of aluminum 40 is deposited comprises more than 35 at.% of nickel.

Furthermore, unlike the method according to the prior art, it is not necessary for the substrate 10 to contain nickel, since the contribution of nickel intended to diffuse in the layer of aluminum 40 comes from the layer of nickel 30 that is deposited on the layer of platinum 20 that has been deposited on said substrate 10. The method according to the invention can therefore be used on any substrate 10, and not only nickel-based superalloys. For example, the method according to the invention may be used on any superalloy.

After deposition of the layer of aluminum 40, it is possible to deposit another material on that layer, for example a ceramic thermal barrier when the part thus coated is designed for high temperature applications.

The invention claimed is:

1. A method for depositing an aluminizing coating on a substrate, comprising:
   (a) depositing a first layer containing platinum on a surface of the substrate by electrolysis using a first electrolytic bath containing platinum salts, then depositing a second layer containing nickel on the first layer by electrolysis using a second electrolytic bath containing nickel salts, the second layer is made up of nearly 100% nickel, and the depositing of the first layer and the depositing of the second layer being performed consecutively in a same facility at ambient pressure; and
   (b) depositing an aluminum coating directly on the second layer.

2. The method according to claim 1, wherein the substrate is a superalloy.

3. The method according to claim 2, wherein the superalloy is a nickel-based superalloy.

4. The method according to claim 1, wherein before the deposition of the first layer and the second layer in (a), the surface of the substrate is prepared.

5. The method according to claim 1, wherein no diffusion treatment of the first layer is done.

6. The method according to claim 1, wherein the aluminum coating is deposited by chemical vapor deposition.

7. The method according to claim 1, wherein the first layer consists essentially of platinum.

8. The method according to claim 1, wherein the second layer does not comprise platinum.

9. The method according to claim 1, wherein the depositing the aluminum coating consists essentially of depositing aluminum atoms.

10. The method according to claim 1, wherein the second layer is made up of 100% nickel.

* * * * *